(12) United States Patent
Yan (10) Patent No.: US 12,161,049 B2
(45) Date of Patent: Dec. 3, 2024

(54) DIGITAL CHIP-BASED DIGITAL DRIVING METHOD FOR PIEZOELECTRIC CERAMIC TRANSFORMER

(71) Applicant: SHANGHAI WOEION HEALTH TECH GROUP CO. LTD., Shanghai (CN)

(72) Inventor: Shihong Yan, Taiyuan (CN)

(73) Assignee: SHANGHAI WOEION HEALTH TECH GROUP CO. LTD., Shanghai (CN)

( * ) Notice: Subject to any disclaimer, the term of this patent is extended or adjusted under 35 U.S.C. 154(b) by 0 days.

(21) Appl. No.: 18/289,370

(22) PCT Filed: Nov. 24, 2021

(86) PCT No.: PCT/CN2021/132599
§ 371 (c)(1),
(2) Date: Nov. 3, 2023

(87) PCT Pub. No.: WO2022/233122
PCT Pub. Date: Nov. 10, 2022

(65) Prior Publication Data
US 2024/0276885 A1    Aug. 15, 2024

(30) Foreign Application Priority Data
May 6, 2021 (CN) .......................... 202110490455.6

(51) Int. Cl.
*H10N 30/80* (2023.01)
*G06F 1/02* (2006.01)
*H10N 30/40* (2023.01)

(52) U.S. Cl.
CPC ........... *H10N 30/804* (2023.02); *G06F 1/022* (2013.01); *H10N 30/40* (2023.02)

(58) Field of Classification Search
CPC ....... H10N 30/40; H10N 30/804; G06F 1/022
USPC ......................................................... 310/318
See application file for complete search history.

(56) References Cited

U.S. PATENT DOCUMENTS

2006/0227576 A1 * 10/2006 Yasumura ............. H02M 3/335
                                                        363/21.02
2010/0125292 A1 *  5/2010 Wiener .......... A61B 17/320068
                                                        606/169
2022/0395033 A1 * 12/2022 Stevenson ............ A41D 13/008

FOREIGN PATENT DOCUMENTS

CN            105356298 B    6/2016

* cited by examiner

*Primary Examiner* — Emily P Pham
*Assistant Examiner* — Monica Mata
(74) *Attorney, Agent, or Firm* — Ying-Ting Chen (57) ABSTRACT

Disclosed is a digital chip-based digital driving method for a piezoelectric ceramic transformer, comprising the following steps: in a case where there is a variation in temperature and/or humidity, acquiring an output voltage of the piezoelectric ceramic transformer after rectification via a high voltage sampling circuit; sending the acquired output voltage signal to a single chip microprocessor DDS generator, comparing the acquired output voltage with a preset voltage by the single chip microprocessor DDS generator, and adjusting the frequency of the driving signal in a case where a difference between the acquired output voltage and the preset voltage exists; and adjusting a boost ratio of the piezoelectric ceramic transformer by the frequency of the driving signal, so as to output the preset voltage by the piezoelectric ceramic transformer.

4 Claims, 5 Drawing Sheets

DIGITAL CHIP-BASED DIGITAL DRIVING METHOD FOR PIEZOELECTRIC CERAMIC TRANSFORMER

CROSS REFERENCE OF RELATED APPLICATION

This application claims the benefit under 35 U.S.C. § 119 from International Application No. PCT/CN2021/132599, which claims priorities to CN 202110490455.6, filed May 6, 2021, the entire contents of which are hereby incorporated by reference in their entireties for teachings of additional or alternative details, and/or features.

The disclosure relates to a digital driving method, in particular to a digital chip-based digital driving method for a piezoelectric ceramic transformer.

BACKGROUND

Generating high voltage negative ions with a piezoelectric ceramic transformer has the characteristics of small size, high working frequency, and not easy to be broken down by high voltage. The conventional piezoelectric ceramic transformer driving technology uses analog technology, with the resonance and the output voltage of the piezoelectric ceramic transformer serving as analog negative feedback signal input. The analog driving mode for piezoelectric ceramic has the defects of unstable output voltage, difficult-to-start resonance, complex circuit and easily being influenced by ambient temperature.

SUMMARY

The object of the disclosure is to solve the above problems, providing a digital chip-based digital driving method for a piezoelectric ceramic transformer, so that the output voltage of the piezoelectric ceramic transformer is stable.

In order to realize the above object, the disclosure provides the following technical proposal: a digital chip-based digital driving method for a piezoelectric ceramic transformer, which comprises the following steps:

acquiring an output voltage of the piezoelectric ceramic transformer after rectification:

comparing the acquired output voltage with a preset voltage, and in a case where a difference exists therebetween, adjusting a frequency of the driving signal; and adjusting a boost ratio of the piezoelectric ceramic transformer by the frequency of the driving signal, so as to output the preset voltage by the piezoelectric ceramic transformer.

Further, the method comprises: in a case where there is a variation in temperature and/or humidity, acquiring the output voltage of the piezoelectric ceramic transformer after rectification: comparing the acquired output voltage with a preset voltage, and in a case where a difference exists therebetween, adjusting a frequency of the driving signal; and adjusting a boost ratio of the piezoelectric ceramic transformer by the frequency of the driving signal, so as to output the preset voltage by the piezoelectric ceramic transformer.

Further, the method comprises: acquiring a driving circuit current of the piezoelectric ceramic transformer, and in a case where the driving circuit current exceeds a preset current, turning off the driving circuit.

Compared with the related art, the disclosure has the following beneficial effects: the disclosure can change the driving frequency in a digital way, thereby changing the boost ratio of the piezoelectric ceramic transformer and finally stabilizing the output voltage, so that the piezoelectric ceramic transformer has stable output voltage, strong environmental adaptability and high reliability.

DETAILED DESCRIPTION OF THE EMBODIMENTS

A circuit, negative ion generating circuit, involved in the embodiment can be shown in FIGS. 1 to 7 and a detailed description of the circuit is given in embodiment 4. It should be noted that the digital chip-based digital driving method for the piezoelectric ceramic transformer comprises but is not limited to the above circuit.

Embodiment 1

The embodiment relates to a digital chip-based digital driving method for a piezoelectric ceramic transformer, which comprises the following steps: acquiring an output voltage of the piezoelectric ceramic transformer after rectification, via a high voltage sampling circuit:

sending the acquired output voltage signal to a single chip microprocessor DDS generator, which is that the acquired output voltage is sent to the single chip microprocessor DDS generator via a voltage signal amplifier circuit, comparing the acquired output voltage with a preset voltage by the single chip microprocessor DDS generator, and adjusting the frequency of the driving signal in a case where a difference between the acquired output voltage and the preset voltage exists:

adjusting a boost ratio of the piezoelectric ceramic transformer by the frequency of the driving signal, so as to output the preset voltage by the piezoelectric ceramic transformer;

acquiring a driving circuit current of the piezoelectric ceramic transformer by the current sampling circuit, and turning off the driving circuit in a case where the driving circuit current exceeds a preset current. For example, the driving circuit acquires the current signals via the current sampling circuit and sends to the single chip microprocessor DDS generator. In a case where the driving circuit current exceeds the preset current (for example, 500 mA), the driving circuit (for example, MOS transistor) is forcibly turned off to protect the safety and reliability of the circuit.

Embodiment 2

The embodiment relates to a digital chip-based digital driving method for a piezoelectric ceramic transformer, which comprises the following steps: in a case where there is a variation in temperature and/or humidity, acquiring an output voltage of the piezoelectric ceramic transformer after rectification, via a high voltage sampling circuit:

sending the acquired output voltage signal to a single chip microprocessor DDS generator, which is that the acquired output voltage is sent to the single chip microprocessor DDS generator via a voltage signal amplifier circuit, comparing the acquired output voltage with a preset voltage by the single chip microprocessor DDS generator, and adjusting the frequency of the driving signal in a case where a difference between the acquired output voltage and the preset voltage exists:

adjusting a boost ratio of the piezoelectric ceramic transformer by the frequency of the driving signal, so as to output the preset voltage by the piezoelectric ceramic transformer:

acquiring a driving circuit current of the piezoelectric ceramic transformer by the current sampling circuit, and turning off the driving circuit in a case where the driving circuit current exceeds a preset current. For example, the driving circuit acquires the current signals via the current sampling circuit and sends to the single chip microprocessor DDS generator. In a case where the current exceeds the preset current (for example, 500 mA), the driving circuit (for example, MOS transistor) is forcibly turned off to protect the safety and reliability of the circuit.

Embodiment 3

The basic proposal of the embodiment is similar to embodiment 1 or embodiment 2, which comprises sending the acquired output voltage signal to a single chip microprocessor DDS generator, which is that the acquired output voltage is sent to the single chip microprocessor DDS generator via a voltage signal amplifier circuit, comparing the acquired output voltage with a preset voltage by the single chip microprocessor DDS generator, and adjusting the frequency of the driving signal in a case where a difference between the acquired output voltage and the preset voltage exists. The difference in the embodiment is that the frequency of the driving signal can be adjusted in the following manner: making a DDS frequency generator by software with a single chip microcomputer and an external reference crystal oscillator, for adjusting the frequency of the driving signal. That is, the single chip microcomputer can adjust the output frequency in a wide range via the frequency divider, and can also accurately adjust the output frequency via the software DDS, so as to accurately control the output voltage.

Embodiment 4

Figure 1:
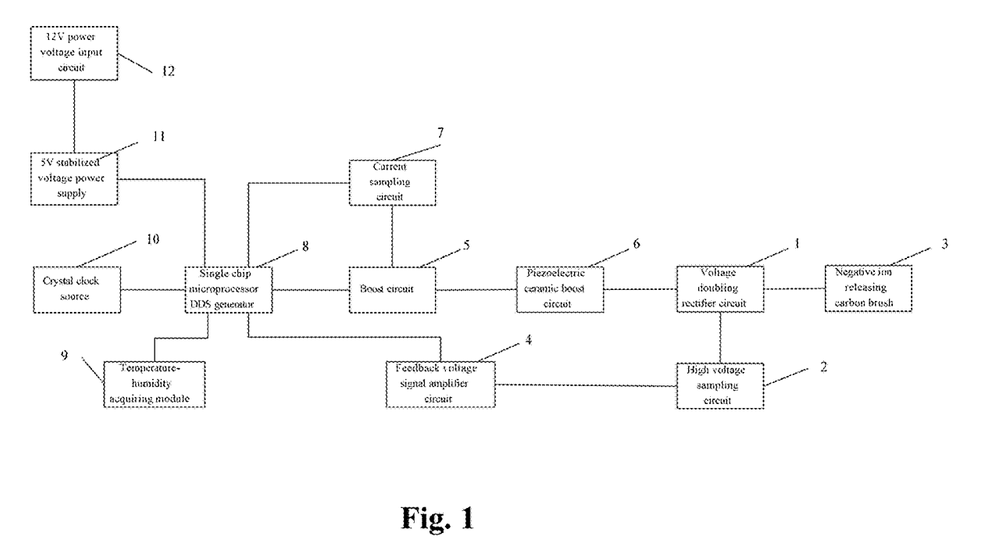
FIG. 1 is a schematic diagram of a driving circuit of the digital chip-based digital driving method for a piezoelectric ceramic transformer.

The embodiment relates to a negative ion generating circuit, as shown in FIG. 1, which comprises a voltage doubling rectifier circuit 1 as a diode voltage doubling rectifying portion, a high voltage sampling circuit 2 as a dividing voltage sampling circuit, a negative ion releasing carbon brush 3 for high voltage outputting and connecting the carbon brush to release negative ions, a feedback voltage signal amplifier circuit 4 as a sampling voltage amplifying buffer circuit, a boost circuit 5 as a driving circuit of the piezoelectric transformer, a piezoelectric ceramic boost circuit 6 as a piezoelectric ceramic transformer boosting transducer module, a current sampling circuit 7 as an overcurrent sampling circuit of the piezoelectric ceramic driving circuit, a single chip microcomputer DDS generator 8, a temperature-humidity acquiring module 9, a crystal clock source 10, a 5V stabilized voltage power supply 11, and a 12V power voltage input circuit 12. The power module of the negative ion generating circuit comprises the 5V stabilized voltage power supply 11 and the 12V power voltage input circuit 12 to supply power for the entire negative ion generating circuit.

The negative ion generating circuit based on temperature-humidity adjusting employs a single chip microcomputer DDS generator 8 as the main control unit. As can be seen from FIG. 1, the single chip microcomputer DDS generator 8 is electrically connected to the power module, the crystal clock source 10, and the temperature-humidity acquiring module 9, the negative ion releasing carbon brush 3 is electrically connected to the voltage doubling rectifier circuit 1, the voltage doubling rectifier circuit 1 is electrically connected to the piezoelectric ceramic boost circuit 6, the piezoelectric ceramic boost circuit 6 is electrically connected to the boost circuit 5, and the boost circuit 5 is connected to the single chip microcomputer DDS generator 8.

Figure 2:
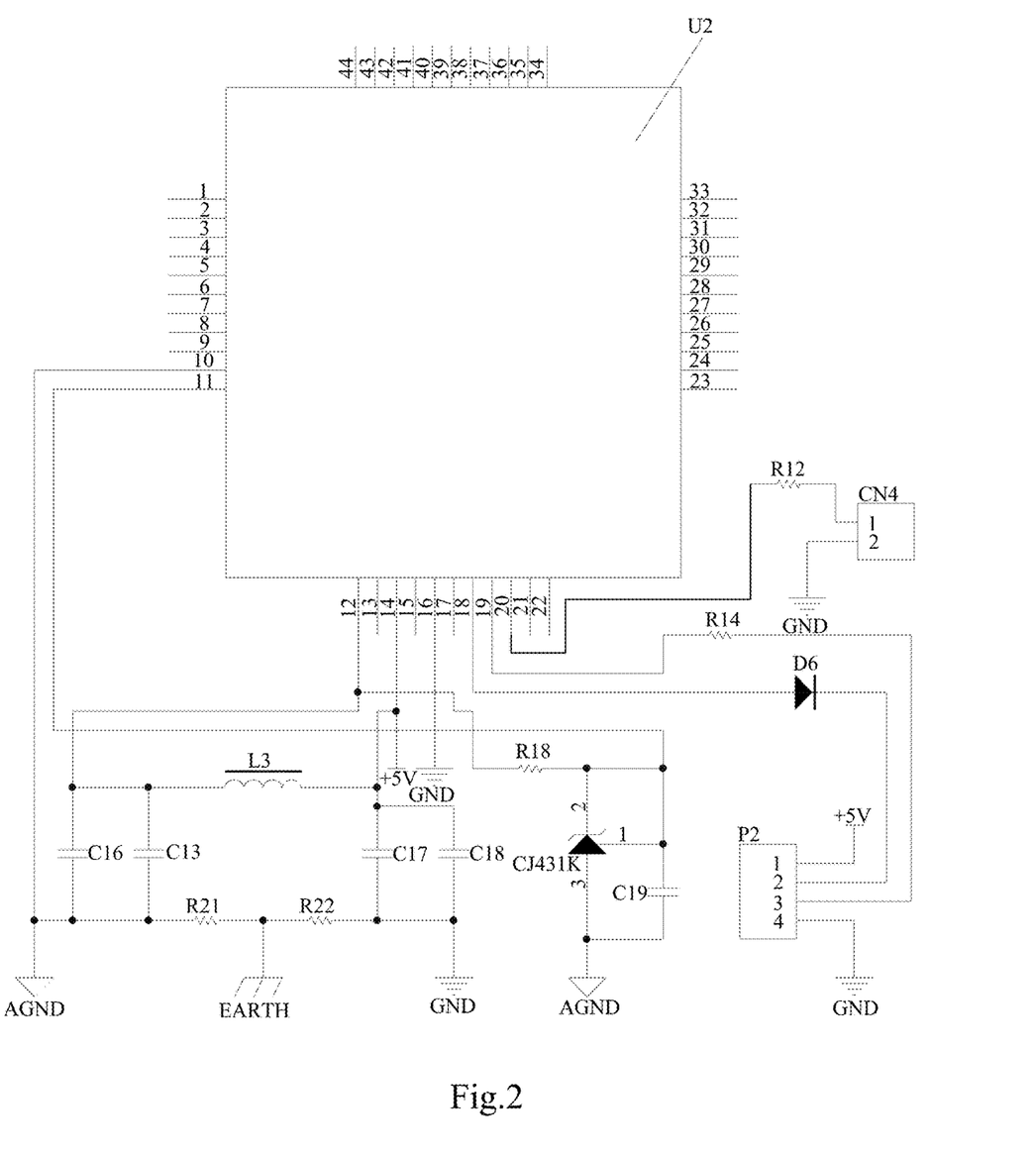
FIG. 2 is a circuit diagram of the single chip microcomputer DDS (Direct Digital Synthesis) generator and the reference voltage generating circuit.

The control chip U2 employed as the main control unit in the embodiment comprises but is not limited to the STC8A8K64S4A12_LQFP44 chip shown in FIG. 2. The single chip microcomputer DDS generator is connected to a reference voltage generating circuit. As can be seen from FIG. 2, the reference voltage generating circuit comprises capacitor C16, capacitor C13, inductor L3, and resistor R18 connected to pin 12 of the control chip U2, capacitor 16 and capacitor C25 are connected to analog ground AGND, inductor L3 is connected to capacitor C17 and capacitor C18, inductor L3 is connected to pin 14 of control chip U2 and connected to 5V power supply, capacitor C17 and capacitor C18 are grounded (GND), resistor R21 and resistor R22 are respectively connected between capacitor C17 and capacitor C13, and the joint between resistor R21 and resistor R22 is grounded (EARTH). The other end of resistor R18 is connected to pin 2 of voltage reference chip CJ431K, pin 1 of voltage reference chip CJ431K and resistor R18 is connected to pin 11 of control chip U2, capacitor C19 is connected between pin 1 and pin 3 of voltage reference chip CJ431K, and pin 3 of voltage reference chip CJ431K is connected to analog ground (AGND).

The voltage doubling rectifier circuit is connected to a high voltage sampling circuit, and the high voltage sampling circuit is connected to a single chip microcomputer DDS generator via a feedback voltage signal amplifier circuit. The boost circuit is connected to a current sampling circuit which is electrically connected to the single chip microcomputer DDS generator.

Figure 3:
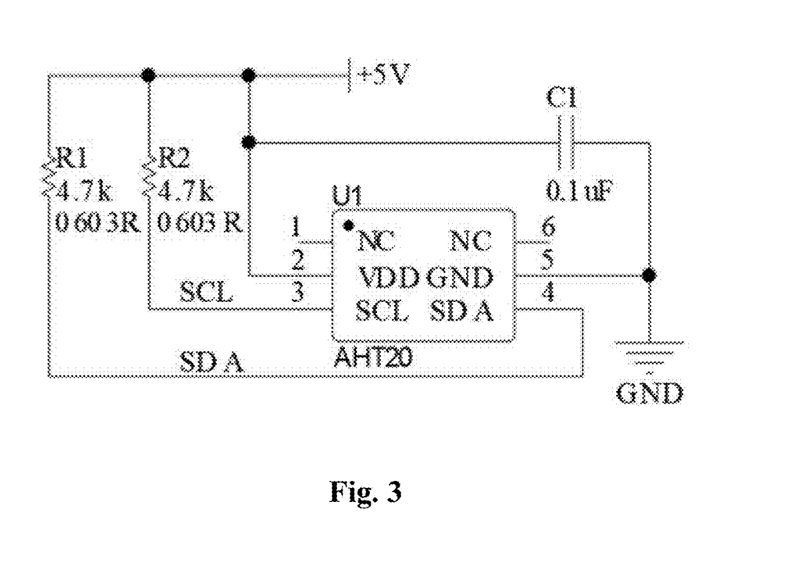
FIG. 3 is a circuit diagram of the temperature-humidity acquiring module.

With reference to FIG. 3, the temperature-humidity acquiring module comprises a control chip U1 (such as AHT20), pin 1 and pin 6 of the control chip U1 are empty pins (suspended), pin 2 of the control chip U1 are connected to 5V power supply, pin 3 and pin 4 of the control chip U1 are connected to single chip microcomputer DDS generator, pin 3 of the control chip U1 is connected to 5V power supply via resistor R2, pin 4 of the control chip U1 is connected to 5V power supply via resistor R1, capacitor C1 is connected between pin 5 and pin 2 of the control chip U1, and pin 5 of the control chip U1 is grounded. The temperature-humidity acquiring module acquires a temperature data and a humidity data to feedback corresponding signals to the single chip microcomputer DDS generator.

In addition, continuing to refer to FIG. 2, it can be seen that pin 18 of the control chip U2 is connected to diode D6, and diode D6 is connected to connector P2 to prevent the programming current from being input into the single chip microcomputer in reverse. The pin 20 of the control chip U2 is connected to a resistor R12, and the resistor R12 is connected to a connector CN4 so as to shortly connect to the circuit CN4 to switch to a USB program download mode.

Figure 4:
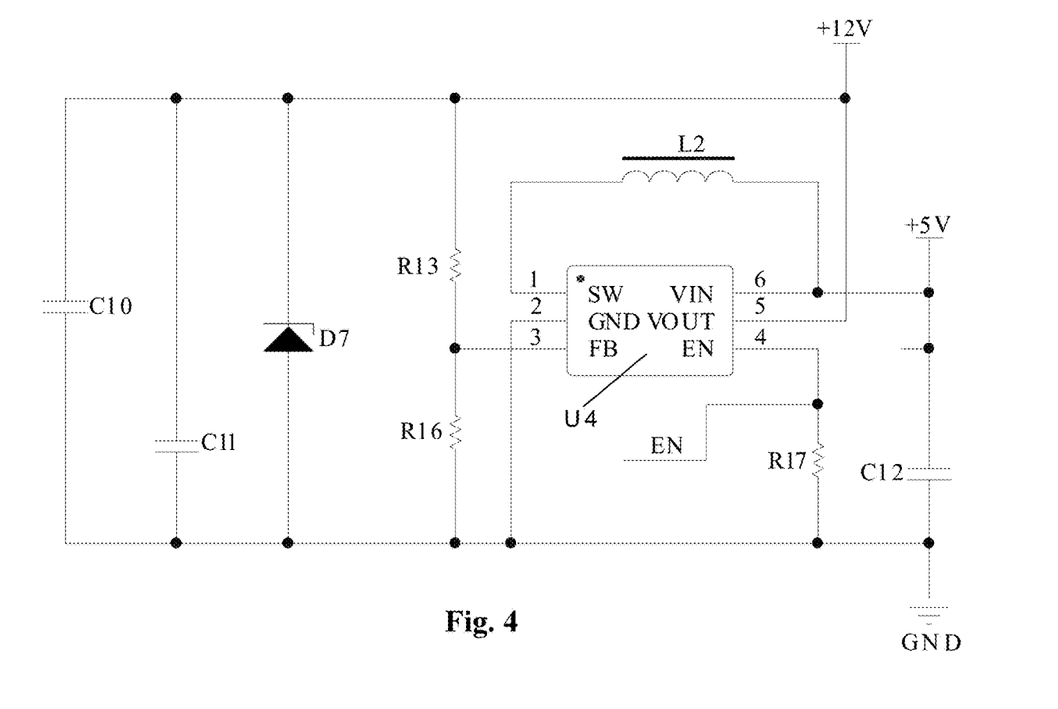
FIG. 4 is a circuit diagram of the power module.

With reference to FIG. 4, the power module employs a DCDC boost circuit which comprises a power management chip U4 (for example, TLV61046ADBVRU4 chip), capacitor C10, capacitor C11, diode D7, resistor R13, resistor R16. Inductor L2 is connected between pin 1 and pin 6 of power management chip U4, pin 6 of power management chip U4 is connected to 5V power supply terminal, pin 2 of power management chip U4 is grounded, pin 4 of power management chip U4 is connected between resistor R13 and resistor R16, the other end of resistor R16 is grounded, the other end of resistor R13 is connected to resistor R13, capacitor C11 is connected in parallel with diode D7, capacitor C10 is connected in parallel with capacitor C11, pin 4 of the power management chip U4 is connected to resistor R7, the other end of resistor R7 is grounded, pin 5 of the power management chip U4 are connected to the 12V power supply terminal, and the 5V power supply terminal is connected to capacitor C12 with the other end grounded.

Figure 5:
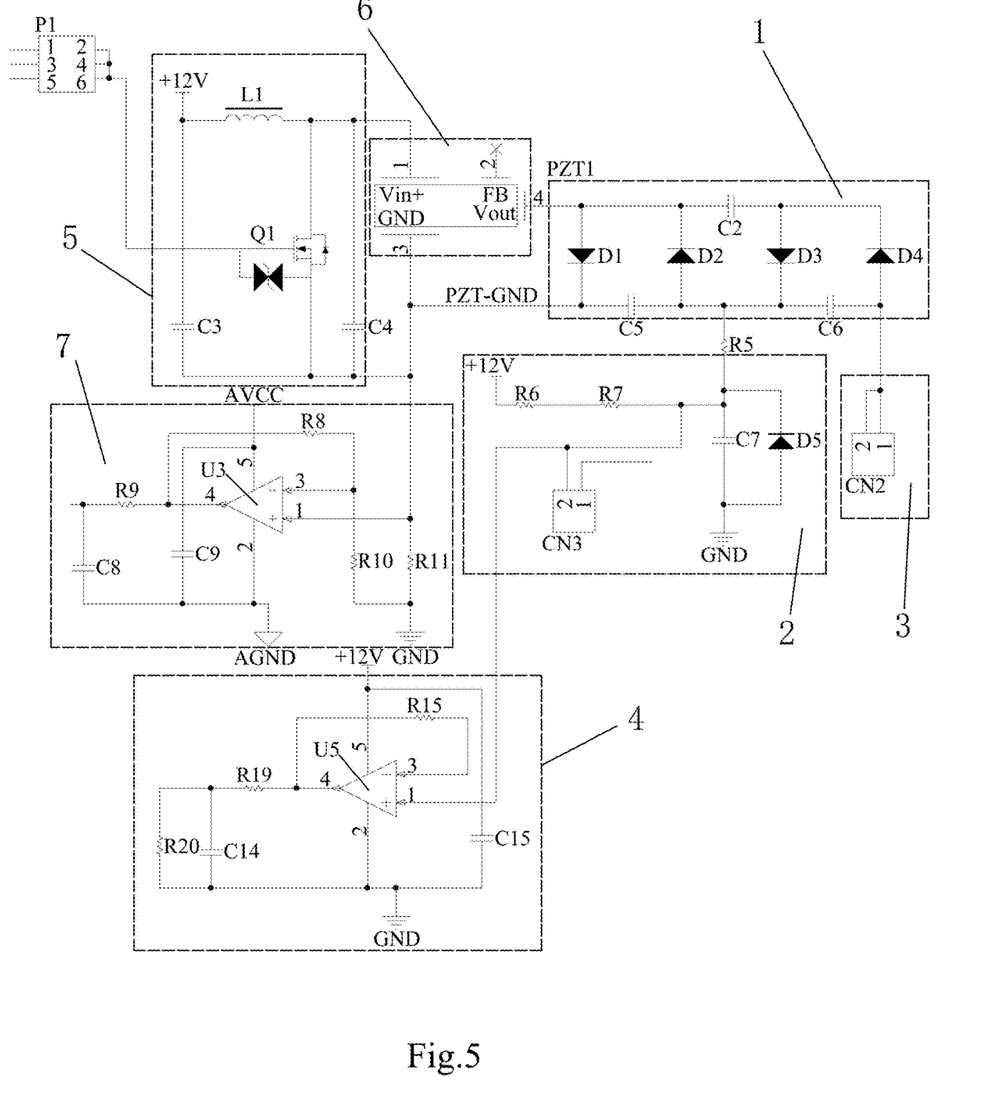
FIG. 5 is a circuit diagram of the boost circuit, the piezoelectric ceramic boost circuit, the voltage doubling rectifier circuit, the high voltage sampling circuit, and the feedback voltage signal amplifier circuit.

With reference to FIG. 5, it can be seen that the boost circuit 5 comprises inductor L1 connected to 12V power supply and capacitor C3, the other end of capacitor C3 is connected to a field effect transistor Q1, the field effect transistor Q1 is connected in parallel with a capacitor C4, inductor L1 is further connected to the field effect transistor Q1, and the boost circuit 5 is connected to a piezoelectric ceramic boost circuit 6. The piezoelectric ceramic transformer PZT1 in the piezoelectric ceramic boost circuit 6 is connected to a voltage doubling rectifier circuit 1, the voltage doubling rectifier circuit 1 has diode D1 connected to pins 3 and 4 of the piezoelectric ceramic transformer PZT1, diode D2 connected in parallel with diode D1, diode D3 connected in parallel with diode D2, diode D4 connected in parallel with diode D3, capacitor C2 is connected between diode D2 and diode D3, and capacitor C5 is connected between diode D1 and diode D2. The voltage doubling rectifier circuit 1 is connected to the negative ion releasing carbon brush 3. The high voltage sampling circuit 2 is connected to the voltage doubling rectifier circuit 1. The high voltage sampling circuit 2 comprises resistor R5 connected between diode D2 and diode D3. The resistor R5 is connected to resistor R7, capacitor C7, and connector CN3 employed when debugging the product and is convenient for the single chip microcomputer to omit running and slowing impulses and directly collect negative high-voltage tests. The capacitor C7 is connected in parallel with diode D5, and one end of capacitor C7 is grounded. The resistor R7 is connected to resistor R6, and resistor R6 is connected to the 12V power supply. The high voltage sampling circuit 2 is connected to a feedback voltage signal amplifier circuit 4. The feedback voltage signal amplifier circuit 4 comprises operational amplifier U5 connected to the high voltage sampling circuit 2, and resistor R15 is connected between pin 3 and pin 4 of the operational amplifier U5. Pin 5 of the operational amplifier U5 is connected to a 12V power supply, one end of capacitor C15 is connected to a 12V power supply, and the other end is grounded. Pin 2 of the operational amplifier U5 is grounded. Pin 4 of the operational amplifier U5 is connected to resistor R19 connected to pin 2 of the control chip U2. Resistor R20 is connected in parallel with capacitor C25, one end of capacitor C25 is connected to resistor R19, and the other end is grounded.

Continuing to refer to FIG. 5, the negative ion generating circuit further comprises a current sampling circuit 7 which comprises operational amplifier U3. Pin 1 of operational amplifier U3 is connected to the boost circuit 5 and the piezoelectric ceramic boost circuit 6, pin 2 of the operational amplifier U3 is grounded, pin 4 of the operational amplifier U3 is connected to resistor R9 and pin 1 of the control chip U2, pin 5 of the operational amplifier U3 is connected to a reference voltage generating circuit, capacitor C9 is connected between pin 5 and pin 2 of the operational amplifier U3, resistor R9 is connected to capacitor C8 of which the other end grounded, resistor R8 is connected between pin 4 and pin 3 of the operational amplifier U3, resistor R8 is connected to resistor R10 of which the other end is grounded, and pin 1 of the operational amplifier U3 is connected to resistor R11 of which the other end is grounded.

In FIG. 5, pin 1 of the connector P1 connected to field effect transistor Q1 is connected to pin 27 of the control chip U2, and pin 3 of the connector P1 is connected to pin 23 of the control chip U2. The field effect transistor Q1 is integrated with an ESD (Electro-Static Discharge) diode to inhibit the damage of static electricity to the device.

Figure 6:
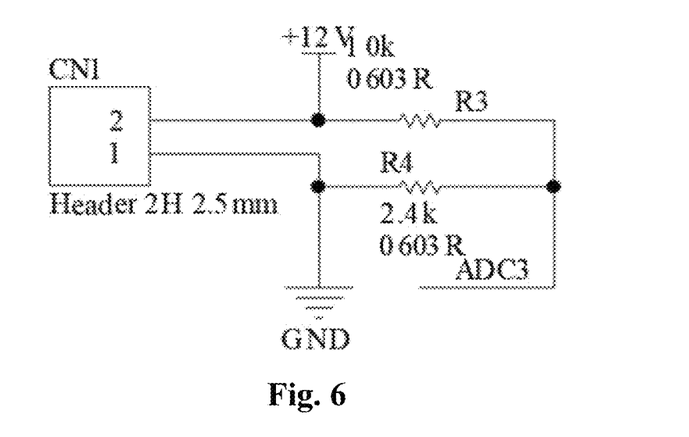
FIG. 6 is a circuit diagram of the power supply voltage fluctuation acquiring circuit.

With reference to FIG. 6, the power voltage fluctuation acquiring circuit, for collecting power supply fluctuation of input voltage, comprises connector CN1 which is 12V independent power supply reserved interface, pin 1 of connector CN1 is grounded, pin 1 of connector CN1 is connected to pin 4 of control chip U2 via resistor R4, pin 2 of connector CN1 is connected to 12V power supply, and pin 2 of connector CN1 is connected to pin 4 of control chip U2 via resistor R3.

Figure 7:
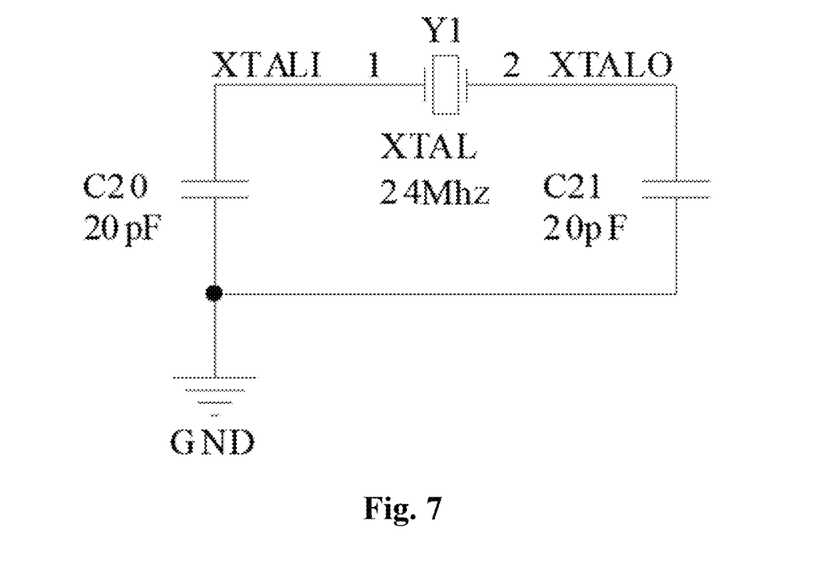
FIG. 7 is a circuit diagram of the clock generating circuit.

With reference to FIG. 7, the clock generating circuit, for generating a reference clock frequency, comprises an external crystal oscillator Y1 connected to the control chip U2, especially pin 8 and pin 9 of the control chip U2, pin 1 of the external crystal oscillator Y1 is connected to capacitor C20 with the other end grounded, and pin 2 of the external crystal oscillator Y1 is connected to capacitor C21 with the other end grounded.

Embodiment 5

Table 1 shows the test data of the relationship between temperature, humidity, and negative ions.

TABLE 1

Test of the relationship between temperature, humidity, and negative ions

Test Definition: Negative high Voltage Value required to maintain 50 w negative ion output
With the mold with floor air supply, 2 pairs in total 4 carbon brushes, the distance between carbon
brushes is 26 mm, 6025 ball 12 V ball fan, and the whole circuit current is 40 mA

| Ambient temperature | Ambient humidity | | | | | | | |
|---|---|---|---|---|---|---|---|---|
| | 10% humidity | 20% humidity | 30% humidity | 40% humidity | 50% humidity | 60% humidity | 70% humidity | 80% humidity |
| 5 degree | −83333 V | −27778 V | −20833 V | −8333 V | −5556 V | −1773 V | −1389 V | −1029 V |
| 10 degree | −50000 V | −16667 V | −12500 V | −5000 V | −3333 V | −1064 V | −833 V | −617 V |
| 15 degree | −33333 V | −11111 V | −8333 V | −3333 V | −2222 V | −709 V | −556 V | −412 V |
| 20 degree | −23810 V | −7937 V | −5952 V | −2381 V | −1587 V | −507 V | −397 V | −294 V |
| 25 degree | −16129 V | −5376 V | −4032 V | −1613 V | −1075 V | −343 V | −269 V | −199 V |
| 30 degree | −12500 V | −4167 V | −3125 V | −1250 V | −833 V | −266 V | −208 V | −154 V |
| 35 degree | −11765 V | −3922 V | −2941 V | −1176 V | −784 V | −250 V | −196 V | −145 V |
| 40 degree | −11111 V | −3704 V | −2778 V | −1111 V | −741 V | −236 V | −185 V | −137 V |

The above is only the preferred embodiment of the present disclosure, and the protection scope of the present disclosure is not limited to the above embodiment, and all technical proposals belonging to the principle of the present disclosure belong to the protection scope of the present disclosure. To one skilled in the art, several modifications made without departing from the principles of the present disclosure are also to be considered within the scope of the present disclosure.

What is claimed is:

1. A digital chip-based digital driving method, for a piezoelectric ceramic transformer, comprising steps:

acquiring an output voltage of the piezoelectric ceramic transformer after rectification via a high voltage sampling circuit;

sending the output voltage signal to a single chip microprocessor DDS generator, comparing the output voltage with a preset voltage by the single chip microprocessor DDS generator, and adjusting a frequency of a driving signal in a case where a difference between the output voltage and the preset voltage exists; and adjusting a boost ratio of the piezoelectric ceramic transformer by the frequency of the driving signal, so as to output the preset voltage by the piezoelectric ceramic transformer;

in a case where there is a variation in temperature and/or humidity, acquiring the output voltage of the piezoelectric ceramic transformer after rectification via the high voltage sampling circuit;

sending the output voltage signal to a single chip microprocessor DDS generator, comparing the output voltage with a preset voltage by the single chip microprocessor DDS generator, and adjusting the frequency of the driving signal in a case where a difference between the output voltage and the preset voltage exists; and adjusting a boost ratio of the piezoelectric ceramic transformer by the frequency of the driving signal, so as to output the preset voltage by the piezoelectric ceramic transformer, wherein a negative ion generating circuit of the digital chip-based digital driving method for a-the piezoelectric ceramic transformer comprises: a voltage doubling rectifier circuit as a diode voltage doubling rectifying portion, the high voltage sampling circuit as a dividing voltage sampling circuit, a negative ion releasing carbon brush for high voltage outputting and connecting the negative ion releasing carbon brush to release negative ions, a feedback voltage signal amplifier circuit as a sampling voltage amplifying buffer circuit, a boost circuit as a driving circuit of the piezoelectric ceramic transformer, a piezoelectric ceramic boost circuit as a piezoelectric ceramic transformer boosting transducer module, a current sampling circuit as an overcurrent sampling circuit the driving circuit of the piezoelectric ceramic transformer, the single chip microcomputer DDS generator, a temperature-humidity acquiring module, a crystal clock source, a 5V stabilized voltage power supply, a power module, a reference voltage generating circuit connected to the single chip microcomputer DDS generator and a 12V power voltage input circuit; wherein the single chip microcomputer DDS generator is electrically connected to the power module, the crystal clock source, and the temperature-humidity acquiring module, the negative ion releasing carbon brush is electrically connected to the voltage doubling rectifier circuit, the voltage doubling rectifier circuit is electrically connected to the piezoelectric ceramic boost circuit, the piezoelectric ceramic boost circuit is electrically connected to the boost circuit, and the boost circuit is connected to the single chip microcomputer DDS generator, wherein the reference voltage generating circuit comprises a capacitor (C16) connected to a pin (12) of a control chip (U2) of the single chip microcomputer DDS generator, a capacitor (C13), an inductor (L3) and a resistor (R18), wherein the inductor (L3) is connected to a capacitor (C17), a capacitor (C18), a pin (14) of the control chip (U2) and connected to a 5V power supply, wherein the capacitor (C17) and the capacitor (C18) are grounded, wherein a resistor (R21) and a resistor (R22) are respectively connected between the capacitor (C17) and the capacitor (C13), wherein a joint between the resistor (R21) and the resistor (R22) is grounded, wherein the resistor (R18) has an end connected to a pin (2) of a voltage reference chip of the reference voltage generating circuit, wherein a pin (1) of the voltage reference chip and the resistor (R18) are connected to a pin (11) of the control chip (U2), a capacitor (C19) is connected between the pin (1) of the voltage reference chip and a pin (3) of the voltage reference chip, and the pin (3) of the voltage reference chip is grounded, wherein the voltage doubling rectifier circuit comprises a diode (D1) connected to a pin (3) and a pin (4) of a piezoelectric ceramic transformer (PZT1) of the piezoelectric ceramic boost circuit, a diode (D2) connected in parallel with the diode (D1), a diode (D3) connected in parallel with the diode (D2), a diode (D4) connected in parallel with the diode (D3), a capacitor (C2) is connected between the diode (D2) and the diode (D3), and a capacitor (C5) is connected between the diode (D1) and the diode (D2).

2. The digital chip-based digital driving method, for the piezoelectric ceramic transformer, according to claim 1, further comprising: acquiring a driving circuit current of the piezoelectric ceramic transformer by a current sampling circuit, and turning off the driving circuit in a case where the driving circuit current exceeds a preset current.

3. The digital chip-based digital driving method, for the piezoelectric ceramic transformer, according to claim 1, wherein the power module comprises a power management chip (U4), a capacitor (C10), a capacitor (C11), a diode (D7), a resistor (R13), a resistor (R16) and an inductor (L2) connected between a pin (1) and a pin (6) of the power management chip (U4), wherein the pin (6) of the power management chip (U4) is connected to a 5V power supply terminal, a pin (2) of the power management chip (U4) is grounded, a pin (4) of the power management chip (U4) is connected between the resistor (R13) and the resistor (R16), and the resistor (R16) has an end grounded, wherein the diode (D7) has an end connected to the resistor (R13) and another end is grounded, the capacitor (C11) is connected in parallel with the diode (D7), the capacitor (C10) is connected in parallel with the capacitor (C11), the pin (4) of the power management chip (U4) is connected to a resistor (R7) and the resistor (R7) has an end grounded, a pin (5) of the power management chip (U4) are connected to a 12V power supply terminal, and the 5V power supply terminal has an end connected to a capacitor (C12) has an end grounded.

4. The digital chip-based digital driving method, for the piezoelectric ceramic transformer, according to claim 1, wherein the boost circuit comprises a field effect transistor (Q1), a capacitor (C4), an inductor (L1) connected to a 12V power supply and the field effect transistor (Q1), wherein the capacitor (C3) has an end connected to the field effect transistor (Q1), the field effect transistor (Q1) is connected in parallel with the capacitor (C4).

* * * * *